United States Patent
Kuroda et al.

(10) Patent No.: US 7,183,829 B2
(45) Date of Patent: Feb. 27, 2007

(54) SEMICONDUCTOR DEVICE INCLUDING A PLURALITY OF CIRCUIT BLOCKS PROVIDED ON A CHIP AND HAVING DIFFERENT FUNCTIONS

(75) Inventors: Naoki Kuroda, Kyoto (JP); Masanori Shirahama, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/773,315

(22) Filed: Feb. 9, 2004

(65) Prior Publication Data

US 2004/0160256 A1 Aug. 19, 2004

(30) Foreign Application Priority Data

Feb. 18, 2003 (JP) ............................. 2003-039188

(51) Int. Cl.
*H03H 11/26* (2006.01)
(52) U.S. Cl. ...................... 327/261; 327/279; 327/286
(58) Field of Classification Search ........ 327/154–156, 327/160–163, 261, 269–273, 276–279, 284–286; 375/354–360; 713/400; 365/233, 233.5
See application file for complete search history.

(56) References Cited

U.S. PATENT DOCUMENTS

| | | | |
|---|---|---|---|
| 5,210,700 A | | 5/1993 | Tom |
| 5,675,265 A | * | 10/1997 | Yamamori ...................... 327/3 |
| 6,081,462 A | * | 6/2000 | Lee ............................. 365/194 |
| 6,194,926 B1 | | 2/2001 | Takahashi et al. |
| 6,202,168 B1 | * | 3/2001 | Saito et al. .................. 713/600 |
| 6,336,190 B1 | * | 1/2002 | Yamagishi et al. ......... 713/400 |
| 6,338,144 B2 | * | 1/2002 | Doblar et al. ............... 713/400 |
| 6,356,096 B2 | * | 3/2002 | Takagi et al. ............... 324/765 |
| 6,396,323 B1 | * | 5/2002 | Mizuno ....................... 327/295 |
| 6,426,662 B1 | * | 7/2002 | Arcus .......................... 327/295 |
| 6,430,725 B1 | * | 8/2002 | Reichle et al. .............. 714/815 |
| 6,470,458 B1 | * | 10/2002 | Dreps et al. ................. 713/400 |
| 6,691,214 B1 | * | 2/2004 | Li et al. ....................... 711/167 |
| 6,717,877 B2 | * | 4/2004 | Suzuki et al. ................ 365/210 |

FOREIGN PATENT DOCUMENTS

| | | |
|---|---|---|
| JP | 03-238555 | 10/1991 |
| JP | 2000-155157 A | 6/2000 |

* cited by examiner

*Primary Examiner*—Timothy P. Callahan
*Assistant Examiner*—Hai L. Nguyen
(74) *Attorney, Agent, or Firm*—McDermott Will & Emery LLP

(57) ABSTRACT

A logic circuit block and a memory circuit block are provided on a semiconductor chip. A timing adjustment circuit block for adjusting the propagation timing of signals is provided on a line between the circuit blocks. A timing adjustment circuit unit includes: a delay element block including a plurality of delay elements for adding different delay amounts to the inter-block signals; a counter circuit block for receiving a timing adjustment control signal from the timing adjustment circuit block; and a fuse circuit block in which a fuse is melted down based on a fuse information signal held by the counter circuit block after a timing verification and which replaces the function of the counter circuit block.

33 Claims, 16 Drawing Sheets

SEMICONDUCTOR DEVICE INCLUDING A PLURALITY OF CIRCUIT BLOCKS PROVIDED ON A CHIP AND HAVING DIFFERENT FUNCTIONS

BACKGROUND OF THE INVENTION

The present invention relates to semiconductor devices each including a plurality of circuit blocks which are provided on one chip and have different functions.

In recent years, system LSI in which a logic circuit and a memory circuit are mounted on a single chip has been actively developed to improve the system performance.

Wiring which connects the logic circuit and the memory circuit provided on the chip is contrived using various placement and routing tools so as to minimize the possibility of a malfunction caused by a signal shift due to variation in wiring width or wiring length or a crosstalk, in a layout design including determination of a floorplan of the chip.

In addition, as shown in FIG. 16, in a chip testing process, connection of signal lines between first and second circuit blocks 101 and 102 provided on a chip 100 is checked by comparing an input signal IN input from the outside to an output signal OUT output to the outside, and means for measuring a delay time of signals transmitted on the lines (now shown) is proposed, thereby preventing a malfunction on the signal lines (see Japanese Laid-Open Publication No. 2000-155157, for example).

However, the above conventional semiconductor device has a drawback of incapability of coping with the malfunction in signal transmission between circuit blocks whose performances have been improved recently. Specifically, incorporation of various function blocks in one chip involved in the current improvement in performance causes the chip area and the clock frequency to increase. As a result, increased wiring length and minute variation among wiring lengths have become problems because a margin for operation decreases accordingly.

In addition, the operational margin of a circuit decreases because of new factors such as a voltage drop of power within the chip, so that it becomes more and more difficult to adjust the timing of signals transmitted between circuit blocks in the chip design.

Moreover, though a test or an evaluation performed on the conventional semiconductor device can detect a malfunction caused by the propagation timing of signals, no means is provided to specify a portion where the malfunction occurs. Even if a portion to be modified is specified, the mask (photomask) needs to be changed. As a result, there also arise other problems of difficulties in shortening the development period and in reducing the cost for the development.

SUMMARY OF THE INVENTION

It is therefore an object of the present invention to reduce the operational margin shortage and a malfunction occurring on signal lines between circuit blocks without changing the mask after testing of the chip.

In order to achieve this object, according to the present invention, a timing adjustment circuit block for adjusting the propagation timing of signals flowing on the lines is provided between circuit blocks connected with the lines in a semiconductor device.

Specifically, a semiconductor device according to the present invention includes: first and second circuit blocks provided on a semiconductor chip and including respective functional elements; and a timing adjustment circuit block for adjusting a propagation timing of a transmission signal flowing on a line connecting the first and second circuit blocks to each other.

In the inventive semiconductor device, the timing adjustment circuit for adjusting the propagation timing of the transmission signal flowing on the line allows the propagation timing of the transmission signal between the blocks to be adjusted without a change of the mask. Accordingly, the yield of chips is enhanced, the cost for development is reduced and the period for the development is shortened.

The inventive semiconductor device preferably further includes a comparison control circuit for receiving an input signal input to the first circuit block and an output signal output from the second circuit block which has received the transmission signal, comparing the input signal to the output signal, and controlling the timing adjustment circuit block.

In the inventive semiconductor device, the line preferably includes a plurality of parallel lines, and each of the first and second circuit blocks includes a shift register connected to the plurality of lines.

In the inventive semiconductor device, the comparison control circuit preferably includes a comparison circuit for comparing logical values obtained by performing logical operation on the input signal and the output signal and outputting the comparison result.

The inventive semiconductor device preferably further includes an input pattern generating circuit for generating and outputting the input signal to the first circuit block. Then, the propagation timing of the transmission signal between the first and second circuit blocks can be easily verified. As a result, the timing verification is performed in a short period.

In the inventive semiconductor device, the timing adjustment circuit block preferably includes a first holding circuit for holding update information in which the propagation timing of the transmission signal is updated.

In this case, the first holding circuit preferably includes at least one fuse. Then, the propagation timing of the transmission signal is performed efficiently.

In that case, the timing adjustment circuit block preferably includes a second holding circuit for holding update information in which the propagation timing of the transmission signal is updated, and the second holding circuit preferably performs a parallel-to-serial conversion on the update information and outputs the conversion result.

If the line includes a plurality of parallel lines, it is preferable that the timing adjustment circuit block repeatedly adjusts the propagation timing of the transmission signal until the input signal and the output signal become the same.

In this case, the timing adjustment circuit block preferably includes a circuit for outputting an adjustment termination notification signal for notifying that adjustments of the propagation timings of all the transmission signals flowing on the lines terminate, and the adjustments of the propagation timings preferably terminate when the input signal and the output signal become the same or when the adjustment termination notification signal is output.

If the inventive semiconductor device includes the comparison control circuit, the comparison control circuit preferably includes a control circuit for outputting timing adjustment control signals to the timing adjustment circuit block when the comparison result shows that the input signal and the output signal differ from each other, and the timing adjustment circuit block preferably includes: a counter circuit for receiving the timing adjustment control signals, and counting and electrically holding the number of the received timing adjustment control signals; a delay element block which includes at least one delay element and in which a delay amount depending on the number of the timing adjustment control signals is added to the transmission signal; and a fuse circuit which includes at least one fuse and holds the number of the timing adjustment control signals in correspondence with the number of fuses which are melted down, wherein an output signal from the counter circuit or an output signal from the fuse circuit is preferably selectively input to the delay element block, and the fuse is preferably melted down based on the output signal from the counter circuit.

In this case, the inventive semiconductor device preferably further includes a switching circuit which generates and outputs a switching control signal for selecting one of the output signals from the counter circuit and the fuse circuit and which includes a fuse.

Also, in the above case, if a result of a verification performed on the propagation timing of the transmission signal is true, the output signal from the counter circuit is preferably switched to the output signal from the fuse circuit.

Also, in the above case, the counter circuit preferably has a high output impedance in normal operation, whereas the fuse circuit preferably has a high output impedance in a verification.

Also, in the above case, the line preferably includes a plurality of parallel lines, and the counter circuit and the fuse circuit preferably share the timing adjustment control signals for respective transmission signals flowing on the plurality of lines. Then, if the timing adjustment of at lest one of the parallel transmission signals flowing between the circuit blocks fails, all the transmission signals can be adjusted at a time. Accordingly, the circuit configuration is simplified as compared to a configuration in which the timings of the signals are individually adjusted. As a result, the chip area can be reduced.

Also, in the above case, the timing adjustment circuit block is preferably also capable of adjusting a propagation timing of a clock signal for determining the propagation timing of the transmission signal.

In this case, the propagation timing of the clock signal is preferably adjusted when the adjustment of the propagation timing of the transmission signal fails. Then, the propagation timings of the respective transmission signals are adjusted with the cycle of the clock signal, which is a basis of the propagation timings of the transmission signals, fixed. If the timing adjustment fails even in this case, the timing of the clock signal is adjusted, so that the timing adjustment can be performed with higher accuracy. As a result, the malfunction is more likely to be prevented.

Also, in the above case, the counter circuit is preferably reset every time the propagation timing of the clock signal is adjusted.

In the above case, the timing adjustment circuit block preferably includes a determination circuit for receiving the output signal from the counter circuit, determining whether the adjustment of the propagation timing of the transmission signal has succeeded or not, and, if it is determined that the adjustment of the propagation timing of the transmission signal has succeeded, outputting a termination signal for terminating a timing verification.

In such a case, the termination signal is preferably output when the number of signals input to the determination circuit exceeds a given value.

In the inventive semiconductor device, the timing adjustment circuit block preferably includes: a determination period signal generating circuit for generating and outputting a determination period signal for determining the propagation timing of the transmission signal, based on a clock signal for determining the propagation timing of the transmission signal; a delay element block which includes at least one delay element and in which a delay is added to the transmission signal; and a fuse circuit which includes at least one fuse, the fuse being melted down based on the determination period signal and a transmission signal which has passed through the delay element block.

Then, a timing lag between the clock signal serving as a basis in determining the propagation timing of the transmission signal and another signal is measured and a fuse corresponding to the timing adjustment is melted down based on the measurement result. Accordingly, the circuit scale of the timing adjustment circuit is reduced, and the timing lag in the propagation timing is measured as intended.

The pulse signal in this case is preferably a signal having a signal determination period including at least one of a set-up period and a hold period of the transmission signal with respect to the clock signal.

In this case, the pulse signal preferably allows at least one of the set-up period and the hold period to be selected with a signal from the outside.

The pulse signal generating circuit in that case preferably generates the pulse signal by performing logical operation on the clock signal and the transmission signal.

In this case, the pulse signal is preferably output to the outside.

It is preferable that the propagation timing of the transmission signal is repeatedly adjusted until the adjustment is completed.

If the inventive semiconductor device includes the comparison control circuit, the semiconductor device preferably further includes an input pattern generating circuit for generating and outputting the input signal to the first circuit block, and the input pattern generating circuit is preferably activated when the comparison result from the comparison control circuit shows that the input signal and the output signal differ from each other. Then, when the comparison results shows that the input and output signals become the same, the adjustment of the propagation timing terminates automatically, so that the timing verification is performed very easily.

If the inventive semiconductor device includes the first holding circuit, the first holding circuit is preferably a nonvolatile memory circuit. Then, the timing adjustment information is held permanently and, in addition, the timing adjustment is repeatedly performed any number of times after the timing verification.

In this case, the timing adjustment circuit block preferably includes a second holding circuit for holding update information in which the propagation timing of the transmission signal is updated, and the update information is preferably written into the nonvolatile memory circuit from the second holding circuit after a verification of the propagation timing terminates.

In the above case, the inventive semiconductor device preferably further includes an internal power-supply circuit for supplying a power-supply voltage to the nonvolatile memory circuit.

Also, in the above case, a power-supply voltage is preferably supplied to the nonvolatile memory circuit from the outside.

If the inventive semiconductor device includes the comparison control circuit, the comparison control circuit preferably includes a control circuit for outputting timing adjustment control signals to the timing adjustment circuit block when the comparison result shows that the input signal and the output signal differ from each other, and the timing adjustment circuit block preferably includes: a counter circuit for receiving the timing adjustment control signals, and counting and electrically holding the number of the received timing adjustment control signals; a delay element block which includes at least one delay element and in which a delay amount depending on the number of the timing adjustment control signals is added to the transmission signal; and a nonvolatile memory circuit. In this case, it is preferable that an output signal from the counter circuit or an output signal from the nonvolatile memory circuit is selectively input to the delay element block, and the number of the timing adjustment control signals is written into the nonvolatile memory circuit based on the output signal from the counter circuit.

In this case, every time the output value of the counter circuit changes, the output value is preferably written into the nonvolatile memory circuit.

In this case, the output value is preferably written into the nonvolatile memory circuit only during a verification of the propagation timing of the transmission signal.

The nonvolatile memory circuit is preferably connected to the delay element block after a verification of the propagation timing of the transmission signal.

In the inventive semiconductor device, one of the first and second circuit blocks is preferably a memory circuit block.

In this case, the inventive semiconductor device preferably further includes an output timing changing circuit for changing the timing of outputting an output signal from the memory circuit block in synchronization with a change of the propagation timing of a clock signal for determining the propagation timing of the transmission signal. Then, it is possible to adjust the propagation timing of the transmission signal, while allowing a sufficient access time to the memory circuit block.

In this case, the output timing changing circuit is preferably provided inside the memory circuit block.

DESCRIPTION OF THE PREFERRED EMBODIMENTS

Embodiment 1

A first embodiment of the present invention will be described with reference to the drawings.

Figure 1:
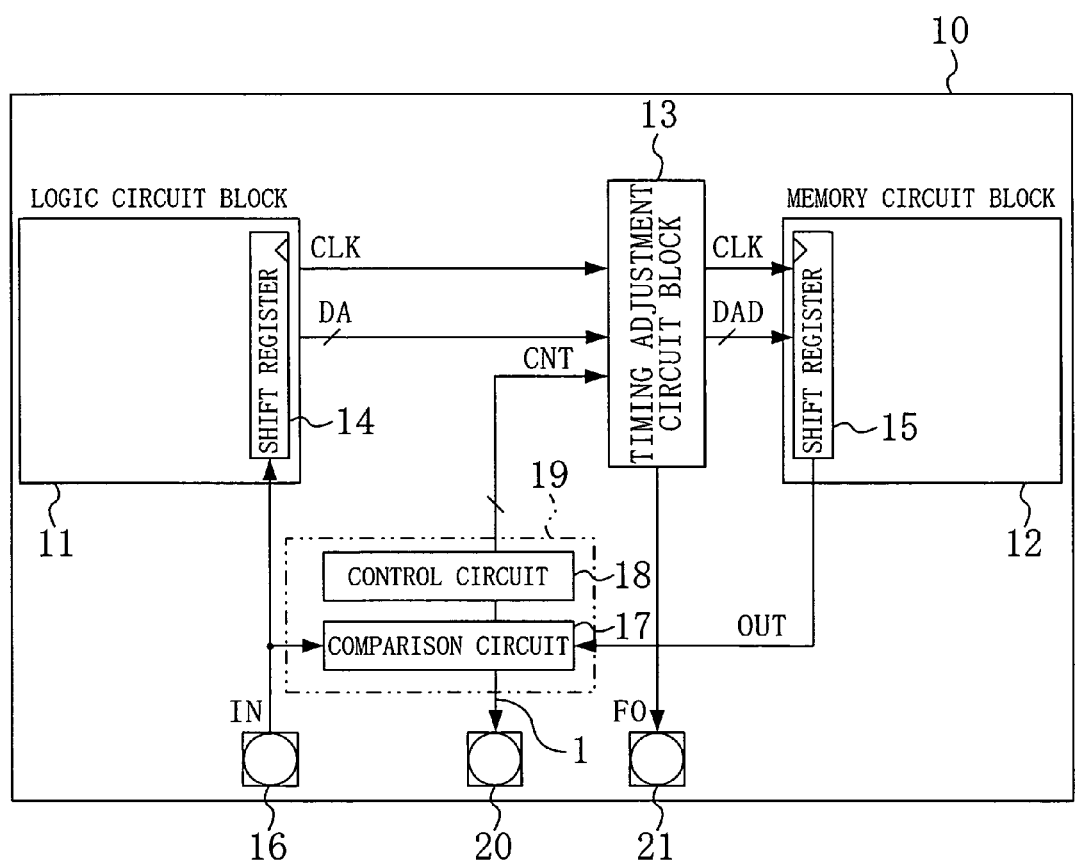
FIG. 1 is a block diagram showing a configuration of a semiconductor device according to a first embodiment of the present invention.

FIG. 1 is a block diagram showing a configuration of a semiconductor device according to the first embodiment.

As shown in FIG. 1, a logic circuit block 11 and a memory circuit block 12 are provided on a semiconductor chip 10. Between the logic circuit block 11 and the memory circuit block 12, a timing adjustment circuit block 13 for adjusting the propagation timing of inter-block signals DA is provided.

In the circuit blocks 11 and 12, a first shift register 14 and a second shift register 15 are respectively incorporated as interface circuits for input and output.

Figure 2:
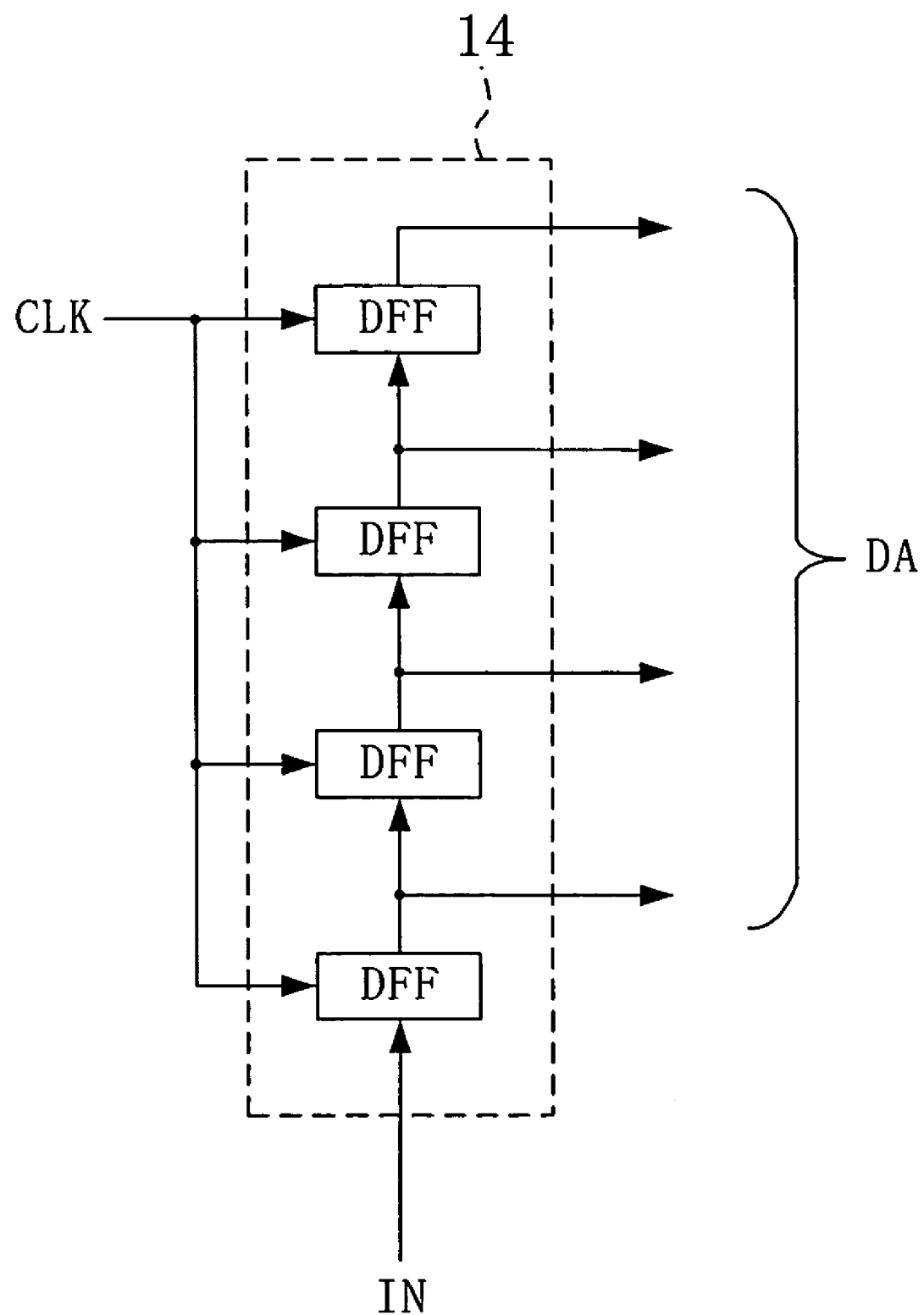
FIG. 2 is a circuit diagram showing a shift register used in the semiconductor device of the first embodiment.

As shown in FIG. 2, the first shift register 14 is formed by, for example, four delay flip-flops (DFFs) connected in series. Every time a clock signal CLK is input, DFFs which have received an input signal IN sequentially transmit the input signal IN to respective adjacent DFFs and also produce outputs. The number of DFFs is, of course, not limited to four and it is sufficient to provide DFFs in a number required of the logic circuit block 11 or the memory circuit block 12.

As shown in FIG. 1, the input signal IN, which has been input from the outside via an input pad 16 and serves as a pattern for verification, is input to the first shift register 14 in the logic circuit block 11. The inter-block signals DA and the clock signal CLK output from the first shift register 14 are input to the timing adjustment circuit block 13. The inter-block signals DA are subjected to a necessary timing adjustment in the timing adjustment circuit block 13 to be changed into inter-block signals DAD. Then, the inter-block signals DAD and the clock signal CLK are input to the second shift register 15 in the memory circuit block 12. The second shift register 15 receiving the inter-block signals DAD outputs an output signal OUT.

On the semiconductor chip 10, there is also provided a comparison control circuit 19 including: a comparison circuit 17 for receiving the input signal IN and the output signal OUT and comparing the values of the received signals; and a control circuit 18 for outputting a high-level, i.e., an activated, timing adjustment control signal CNT to the timing adjustment circuit block 13 if the values of the signals differ from each other. The comparison result from the comparison circuit 17 is also output, as a comparison output signal 1, to the outside via a first output pad 20.

As will be described later, the timing adjustment circuit block 13 includes a fuse circuit for holding the number of timing adjustment control signals CNT associated with the parallel inter-block signals DA. Trimming data for a fuse constituting the fuse circuit is output as, for example, a fuse information signal FO to the outside via a second output pad 21.

Figure 3:
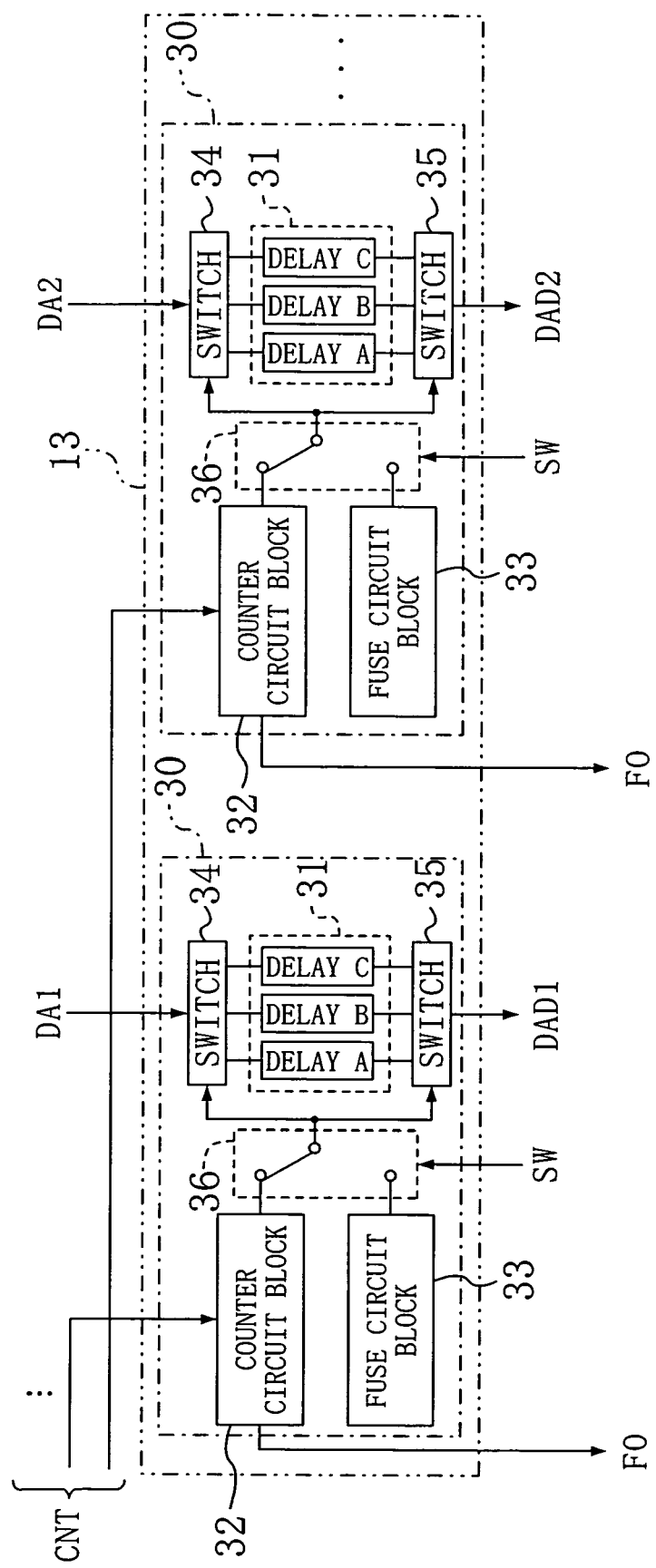
FIG. 3 is a block diagram showing a configuration of a timing adjustment circuit block constituting the semiconductor device of the first embodiment.

FIG. 3 shows a specific example of a configuration of the timing adjustment circuit block 13.

As shown in FIG. 3, the timing adjustment circuit block 13 includes n timing adjustment circuit units 30 associated with n inter-block signals DA1 through DAn (where n is a positive integer).

Each of the timing adjustment circuit units 30 includes: a delay element block 31 including delay elements A, B and C capable of adding different delay amounts to, for example, the inter-block signal DA1; a counter circuit block 32 for receiving the timing adjustment control signals CNT from the timing adjustment circuit block 13; and a fuse circuit block 33 which is trimmed (in which fuses are melted down) based on the fuse information signal FO held by the counter circuit block 32 after a timing verification and which replaces the function of the counter circuit block 32. The delay elements included in the delay element block 31 are not limited to a plurality of delay elements such as the three delay elements A, B and C, and at least one delay element is sufficient.

At the input side and the output side of the delay element block 31, a first switch 34 and a second switch 35 for selecting insertion of one of or none of the delay elements in the delay element block 31 are respectively provided.

There is also provided a third switch 36 for receiving a switching control signal SW form the outside and allowing the first and second switches 34 and 35 to select one of or none of the delay elements A, B and C based on the timing adjustment control signals CNT via the counter circuit block 32 during the timing verification, while allowing the selection based on the fuse information signal FO held by the counter circuit block 32 after the verification.

Figure 4:
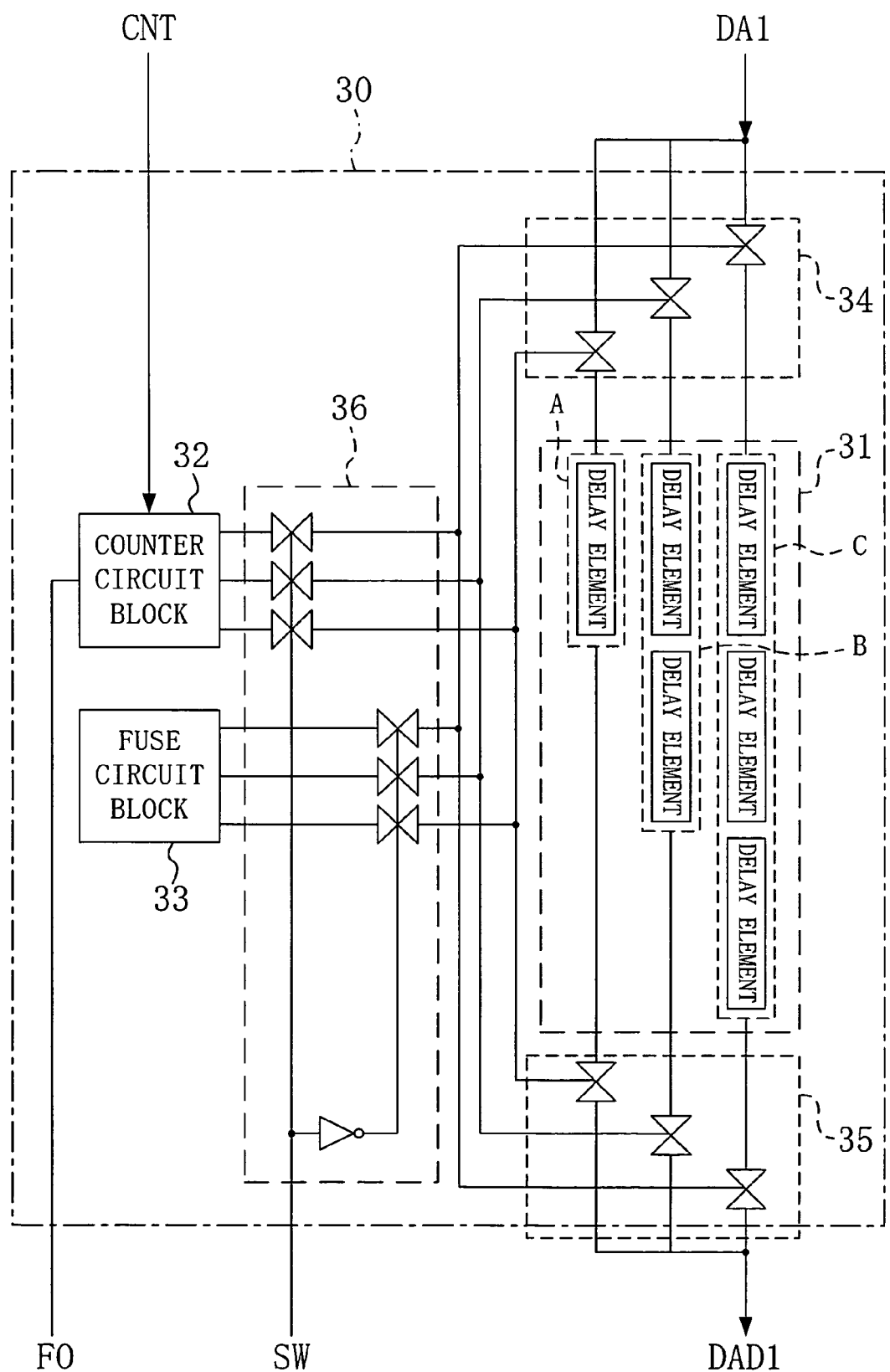
FIG. 4 is a block diagram showing a configuration of a timing adjustment circuit unit constituting the semiconductor device of the first embodiment.

FIG. 4 shows a specific example of the timing adjustment circuit unit 30. In FIG. 4, each member already shown in FIG. 3 is identified by the same reference numeral and the description thereof will be omitted herein.

As shown in FIG. 4, each of the first and second switches 34 and 35 is constituted by three transfer gates associated with the three delay elements A, B and C in the delay element block 31.

The third switch 36 is constituted by six transfer gates. Three of the transfer gates are connected so as to receive the switching control signal SW and to allow the output signals from the counter circuit block 32 to be transmitted to the first or second switch 34 or 35, and the others are connected so as to receive an inverted signal of the switching control signal SW and to allow the output signals from the fuse circuit block 33 to be transmitted to the first or second switch 34 and 35 independently of the output signals from the counter circuit block 32.

Hereinafter, a verification method for verifying and adjusting the propagation timing of the inter-block signals DA transmitted from the logic circuit block 11 to the memory circuit block 12 in the semiconductor device configured as described above will be described with reference to the timing charts shown in FIG. 5.

First, during a timing verification, the third switch 36 shown in FIG. 3 selects the counter circuit block 32.

Figure 5:
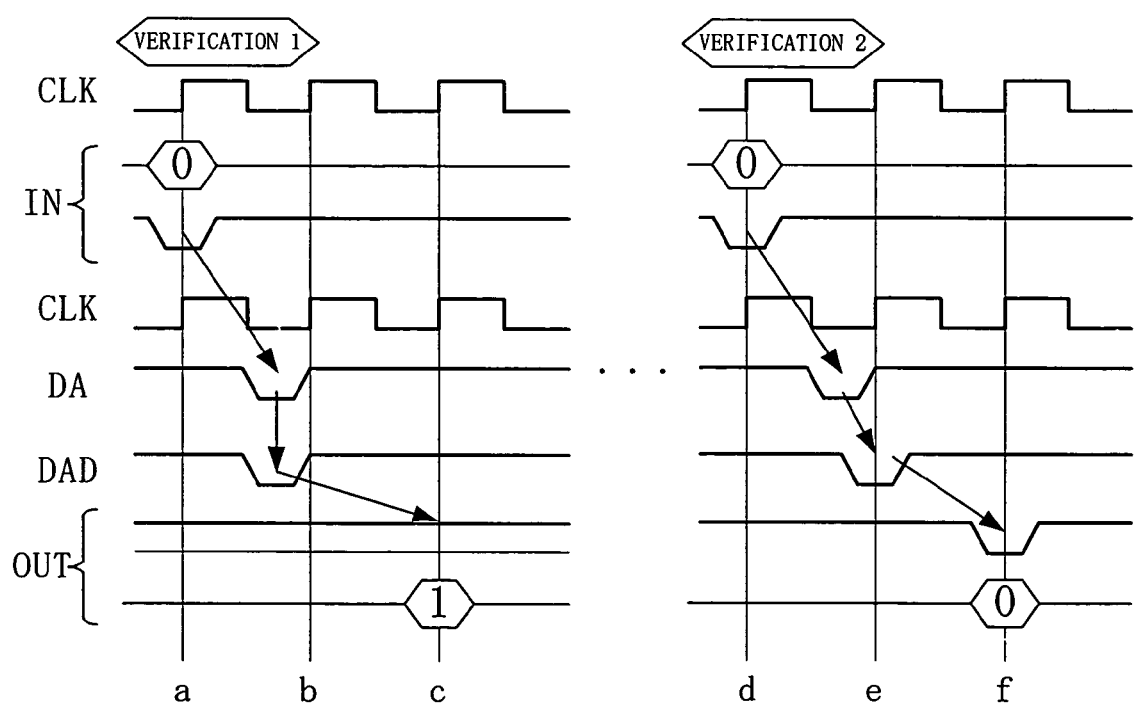
FIG. 5 is timing charts for a timing verification performed on the semiconductor device of the first embodiment.

As shown in FIG. 5, in a first timing verification starting from time a, an input signal IN input with the value "0" is latched by the first shift register 14 in the logic circuit block 11 and then is output as inter-block signals DA to the timing adjustment circuit block 13. A clock signal CLK for allowing the second shift register 15 in the memory circuit block 12 to latch inter-block signals DAD is also transmitted at the same time.

Next, at a verification timing of time b, the inter-block signals DAD that have passed through the timing adjustment circuit block 13 in the memory circuit block 12 are latched by the second shift register 15 with the clock signal CLK. However, since no timing adjustment is performed in the timing adjustment circuit block 13 at time b, there is no timing difference between the inter-block signals DA output from the logic circuit block 11 and the inter-block signals DAD input to the memory circuit block 11. Accordingly, the second shift register 15 in the memory circuit block 12 latches the input data with the value "1" to output the output signal OUT with the value "1" at next time c. Therefore, the comparison control circuit 19 shown in FIG. 1 determines that the logical values of the input and output signals IN and OUT differ from each other and, as a result, outputs a comparison output signal 1 representing a failure to the first output pad 20.

To distinguish the above-described undesirable propagation timing of the signals from a failure in signal connection, the clock frequency or the signal pattern may be changed, for example.

Hereinafter, it will be described how the comparison control circuit and the timing adjustment circuit block operate.

When the comparison circuit 17 in the comparison control circuit 19 shown in FIG. 1 detects the undesirable timing between the input signal IN and the output signal OUT, the comparison circuit 17 activates a timing adjustment control signal CNT to be output from the control circuit 18.

Then, as shown in FIG. 3, the activated timing adjustment control signal CNT is input to the counter circuit block 32 in each of the timing adjustment circuit units 30 associated with the respective parallel inter-block signals DA in the timing adjustment circuit block 13. The counter circuit block 32 that has received the activated timing adjustment control signal CNT increments its counter value by one. Then, connection information held by the first and second switches 34 and 35 connected to the delay element block 31 is changed between the inter-block signals DA and DAD. As a result, a timing difference is created between the inter-block signals DA and DAD.

Examples of methods for changing connection to the delay elements A, B and C include: sequentially changing from the element A with a small delay amount to the element C with a large delay amount; initially setting at the element B with an intermediate delay amount and then changing to the element C with the large delay amount and, if the adjustment is not achieved even with the element C, changing to the element A having a smaller delay amount than the element B; a method in the reversed order; and, in a case where more than three delay elements are provided in the delay element block 31, setting the initial value at the intermediate delay amount, and then changing to elements with a larger amount and a smaller amount alternately, and finally to the element with the minimum or maximum delay amount.

Now, a second timing verification starting from time d will be described with reference to FIG. 5. First, as at time a, an input signal IN with the value "0" is input at time d. In this case, the inter-block signals DAD are obtained by adding a delay amount to the original inter-block signals DA in the timing adjustment circuit block 13 as described above. Accordingly, at next time e, the second shift register 15 in the memory circuit block 12 appropriately latches the signal with the value "0" based on the clock signal CLK. As a result, the logical values of the input and output signals IN and OUT are the same, and the timing verification terminates. Thereafter, the counter circuit blocks 32 in the timing adjustment circuit block 13 output, as fuse information signals FO, delay information held by the counter circuit block 32.

In each of the timing adjustment circuit units 30, the fuse circuit block 33 provided in parallel with the counter circuit block 32 holds delay information in the counter circuit block 32 by using fuses and the number of fuses which are melted down. Accordingly, fuses in the fuse circuit block 33 are melted down based on the fuse information signal FO after the timing verification, so that the state after the timing adjustment performed on the inter-block signals DA is also maintained as intended in normal operation.

During the normal operation, the third switch 36 selects a connection to the fuse circuit block 33 with the switching control signal SW.

Although not shown, another fuse may be provided in a switch control circuit for outputting the switching control signal SW and may be melted down after the verification so that only the fuse circuit block 33 is selected thereafter.

As described above, if the adjustment of propagation timing of the inter-block signals DA fails, the timing adjustment automatically continues independently of human control. When the timing adjustment succeeds, information on the timing adjustment can be fixed using the fuses based on the fuse information signal FO as an output signal from the counter circuit block 32 associated with one of the inter-block signals DA. As a result, the necessity of changing the mask after the timing verification is eliminated, so that the timing adjustment can be performed easily.

Accordingly, in the timing design for the semiconductor chip 10 that is considerably affected by a crosstalk between signal lines or a voltage drop at the power source particularly in large-scale system LSI with high performance, more detailed timing design can be performed on each signal line. In addition, a fine timing adjustment can be performed after the inspection of the entire chip, thus eliminating the need for design changes after the inspection.

The timing verification according to the first embodiment can be performed at the same time with a conventional test of checking connection between circuit blocks. Accordingly, if the timing adjustment circuit block 13, for example, is added to a circuit configuration used for the conventional connection test and a program for allowing verification to be performed in the clock frequency range from a low clock frequency to the actual clock frequency in addition to the frequency of a test signal used for the connection test is added to the verification, the timing verification can be also performed at the same time. As a result, it is unnecessary to perform additional verification steps, so that the verification cost is reduced.

If a large number of parallel inter-block signals DA requiring timing adjustments are provided, the fuse information signals FO may be output one by one serially from the second output pad 21 using a parallel-to-serial converter circuit. Then, the number of pads is reduced, so that the layout area is reduced.

In the first embodiment, the adjustment on the delay element block 31 shown in FIGS. 3 and 4 terminates when the logical values of the input and output signals IN and OUT become the same or when the counter of the counter circuit block 32 reaches its full count, i.e., all the delay elements A, B and C are used completely. In this manner, the termination of the verification is defined, so that the need for unnecessary verification processes is eliminated and thus the verification cost is reduced.

The counter of the counter circuit block 32 shown in FIGS. 3 and 4 is initialized when the power is turned on. Accordingly, the initialization of the counter block 32 is defined and, in addition, delay information in the counter circuit block 32 is held as long as the power is on. As a result, the timing verification can be performed continuously.

In the first embodiment, the timing adjustment circuit block 13 is used only for the inter-block signals DA. In other words, the clock cycle of the clock signal CLK which is a basis of the propagation timing of the inter-block signals DA is not changed, and the timing adjustment of the inter-block signals DA is performed based on only the clock signal CLK. Accordingly, the timing adjustment of the inter-block signals DA is performed easily. In addition, the timing of the clock signal CLK is not adjusted, so that the timing of outputting the output signal from the memory circuit block 12 is not necessarily taken into consideration if a subsequent circuit block is provided.

MODIFIED EXAMPLE 1 OF EMBODIMENT 1

As a first modified example of the first embodiment, the timing adjustment circuit block 13 may be exclusively used for the clock signal CLK. Then, it is sufficient to perform the timing verification only for one signal CLK, resulting in a large reduction in verification time.

MODIFIED EXAMPLE 2 OF EMBODIMENT 1

Figure 6:
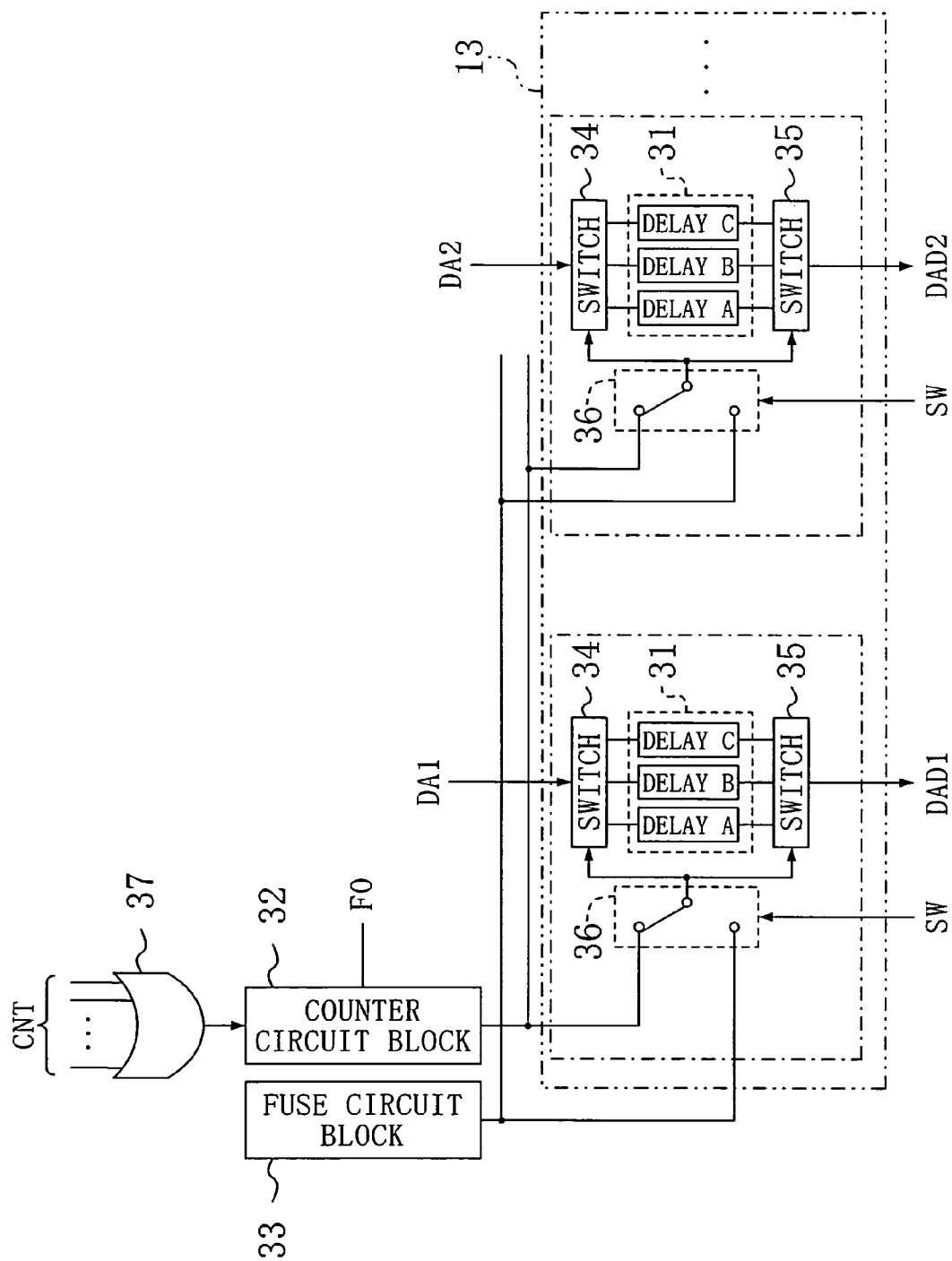
FIG. 6 is a block diagram showing a configuration of a timing adjustment circuit block constituting a semiconductor device according to a second modified example of the first embodiment.

FIG. 6 shows a timing adjustment circuit block according to a second modified example of the first embodiment.

In the configuration shown in FIG. 6, all the timing adjustment control signals CNT to be input to the timing adjustment circuit block 13 are input to an AND circuit 37.

If at least one of the timing adjustment control signals CNT associated with the respective parallel inter-block signals DA is activated, i.e., timing adjustment of at least one of the parallel inter-block signals DA fails, the counter value of the counter circuit block 32 is incremented and a connection between the inter-block signals such as DA1 and DA2 and the delay elements A, B and C constituting the delay element block 31 is switched at the same time.

Then, the verification is easily performed and the time required for the verification is shortened, as compared to a case where timing adjustments of the parallel inter-block signals DA are performed individually.

The timing adjustment control signals CNT, the comparison output signal 1 from the comparison circuit 17 may be used. Then, the number of circuit elements and the number of signal lines are reduced.

In this modified example, all the inter-block signals DA are changed. Alternatively, in consideration of the functions of the inter-block signals DA or the arrangement of the signal lines, a plurality of blocks may be combined so that the inter-block signals DA are changed for each combined blocks.

Embodiment 2

Hereinafter, a second embodiment of the present invention will be described with reference to the drawings.

Figure 7:
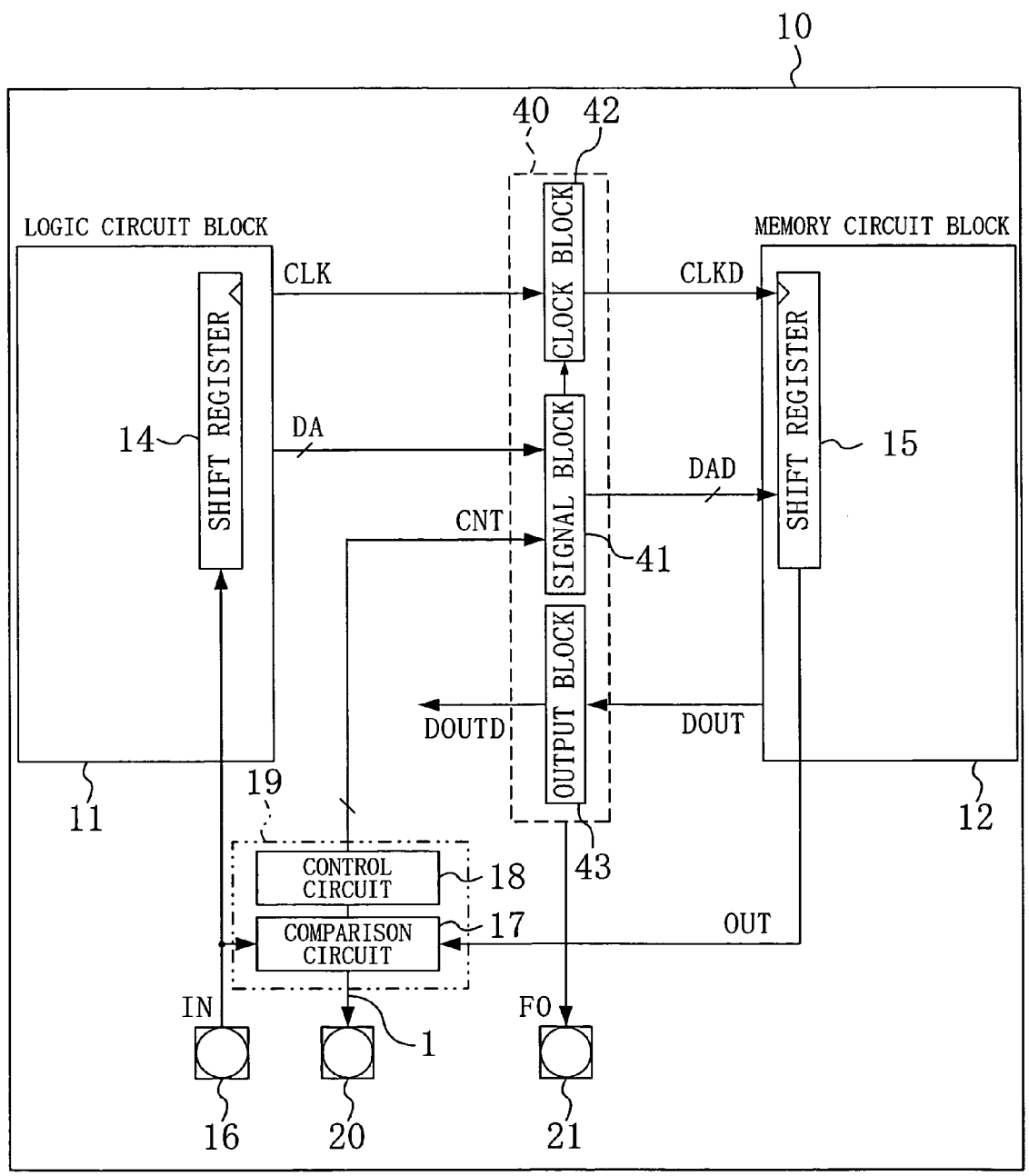
FIG. 7 is a block diagram showing a configuration of a semiconductor device according to a second embodiment of the present invention.

FIG. 7 is a block diagram showing a configuration of a semiconductor device according to the second embodiment. In FIG. 7, each member already shown in FIG. 1 is identified by the same reference numeral and the description thereof will be omitted herein.

In the second embodiment, in a case where the adjustment of the propagation timing of inter-block signals DA is not enough to achieve the timing adjustment, the propagation timing of a clock signal CLK is also adjusted.

As shown in FIG. 7, a timing adjustment circuit block 40 according to the second embodiment includes: a signal block 41 for adjusting the propagation timing of the inter-block signals DA; a clock block 42 for adjusting the propagation timing of the clock signal CLK; and an output block 43 for adjusting the propagation timing of a circuit output signal DOUT from a memory circuit block 12.

Figure 8:
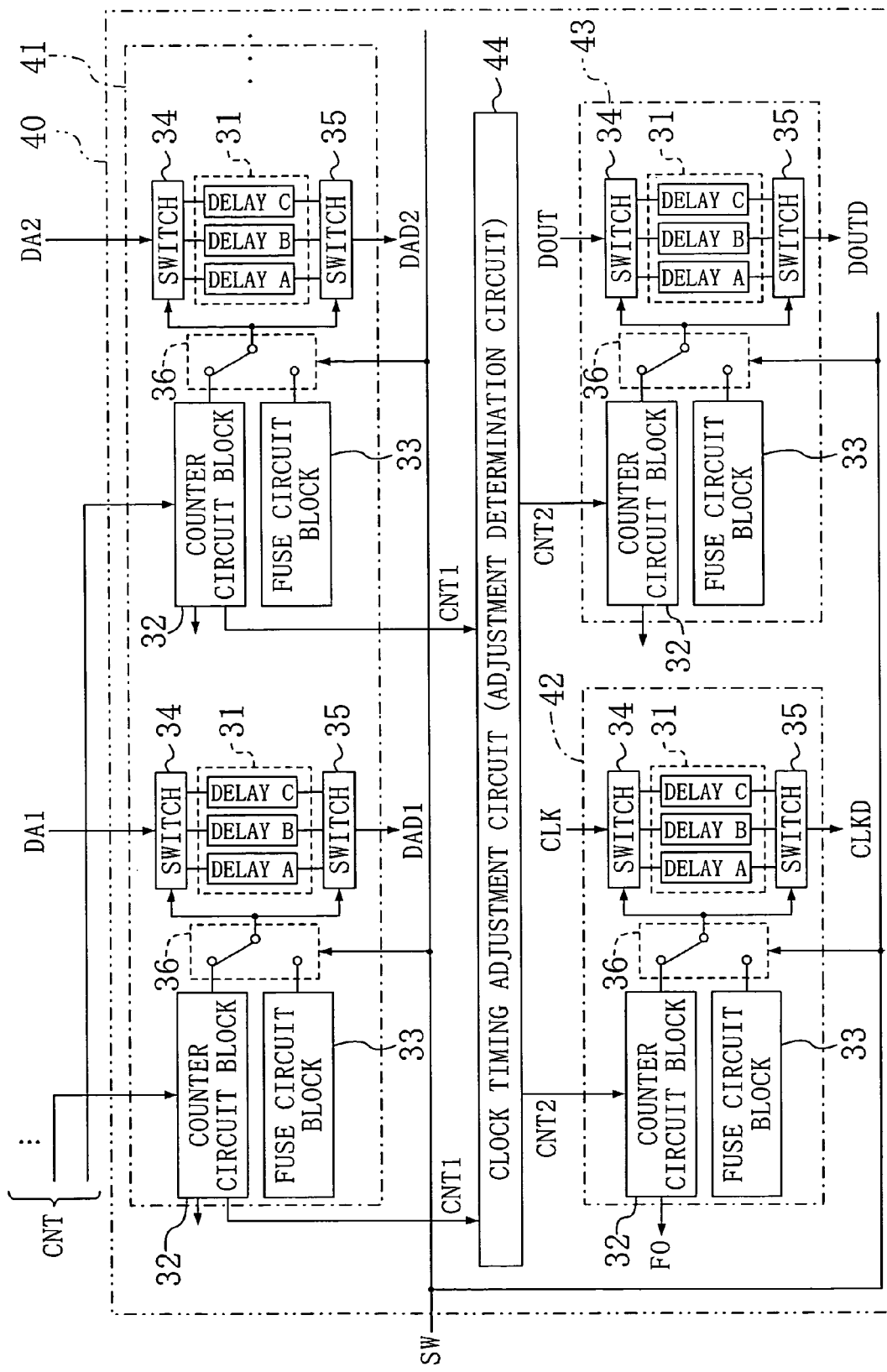
FIG. 8 is a block diagram showing a configuration of a timing adjustment circuit block constituting the semiconductor device of the second embodiment.

FIG. 8 shows a specific example of a configuration of the timing adjustment circuit block 40. In FIG. 8, each member already shown in FIG. 3 is identified by the same reference numeral and the description thereof will be omitted herein.

As shown in FIG. 8, the signal block 41 has the same configuration as that of the timing adjustment circuit block 13 of the first embodiment.

The clock block 42 receives a clock signal CLK and outputs a clock signal CLKD in which a delay amount (including a delay amount of zero) has been added to the clock signal CLK. In the same manner, the output block 43 receives the circuit output signal DOUT from the memory circuit block 12 and outputs a circuit output signal DOUTD in which a delay amount (including a delay amount of zero) has been added to the circuit output signal DOUT.

The clock block 42 and the output block 43 have substantially the same configuration as that of the timing adjustment circuit unit 30 of the first embodiment. Control signals CNT1, which are output signals from respective counter circuit blocks 32 in the signal block 41 are input to a clock timing control circuit 44 serving as an adjustment determination circuit.

When the control signals CNT1 from the counter blocks 32 indicate a failure of the timing adjustment even with all the delay elements A through C in the delay element blocks 31, i.e., indicate that the adjustment is impossible, the clock timing control circuit 44 outputs control signals CNT2 for incrementing the counter values of the respective counter circuit blocks 32 in the signal block 41 and the output block 43.

Figure 9:
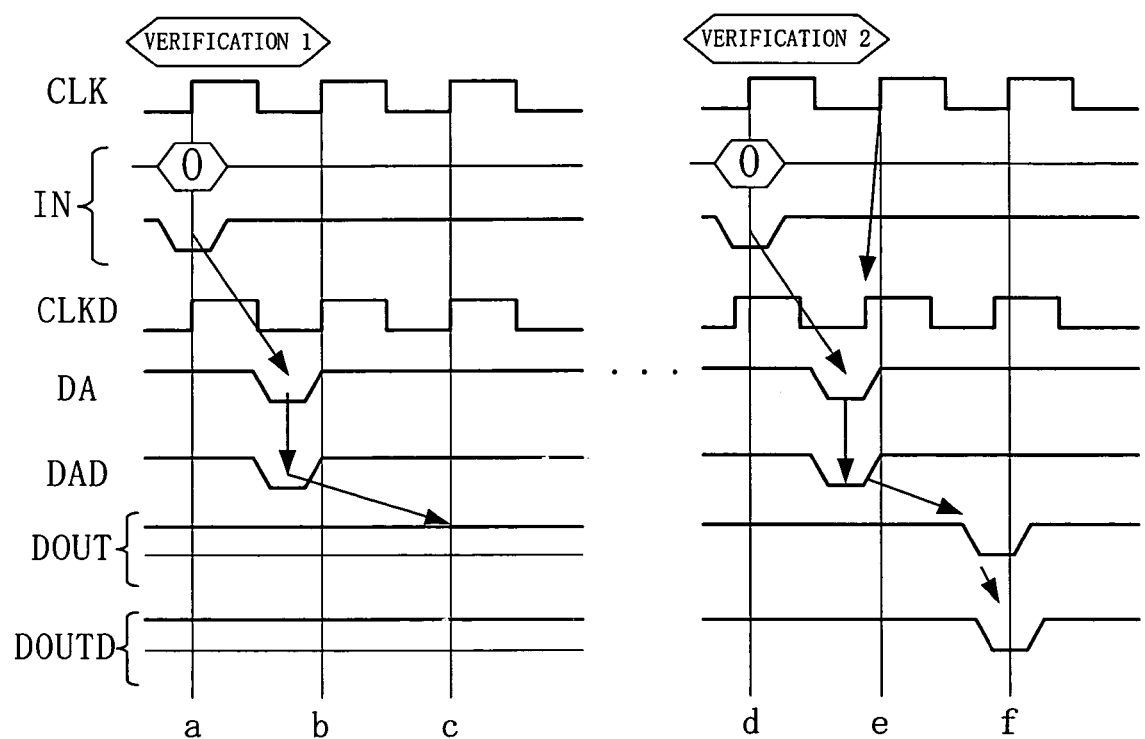
FIG. 9 is timing charts for a timing verification performed on the semiconductor device of the second embodiment.

Hereinafter, a verification method for verifying and adjusting the propagation timing of inter-block signals DA transmitted from a logic circuit block 11 to the memory circuit block 12 in the semiconductor device configured as described above will be described with reference to the timing charts shown in FIG. 9.

First, in a first timing verification, as in the first embodiment, it is determined whether the logical values of input and output signals IN and OUT are the same or not with respect to the parallel inter-block signals DA.

If the logical values of the input and output signals IN and OUT differ from each other even after the delay adjustments have been performed on all the inter-block signals DA, the clock signals CNT1 from the counter circuit blocks 32 in the signal block 41 constituting the timing adjustment circuit block 40 are activated.

The clock timing control circuit 44 receives the activated control signals CNT1 to output an activated control signal CNT2 to the clock block 42, thereby incrementing the counter value of the counter circuit block 32 in the clock block 42. That is, the timing adjustment of the clock signal CLK is initiated.

At the same time, the clock timing control circuit 44 also outputs an activated control signal CNT2 to the output block 43 so that the counter value of the counter circuit block 32 in the output block 43 is incremented. As a result, the circuit output signal DOUT is delayed by an amount corresponding to the delay of the clock signal CLK.

At this time, the counter values of all the counter circuit blocks 32 included in the signal block 41 are initialized.

Next, in a second timing verification, the timing of the inter-block signals DA is adjusted based on the clock signal CLKD subjected to the timing adjustment. This timing adjustment is repeated until the logical values of the input and output signals IN and OUT become the same.

As described above, the timing adjustment of the inter-block signals DA is performed first. If the adjustment is determined to be impossible, the propagation timings of the clock signal CLK and the circuit output signal DOUT are adjusted. Then, the initialized timing adjustment of the inter-block signals DA is performed again based on the adjusted clock signal CLKD, thus allowing the timing adjustment to be performed with higher accuracy.

In the second embodiment, the timing of the circuit output signal DOUT from the memory circuit block 12 is adjusted in accordance with the adjusted delay amount of the clock signal CLKD. Accordingly, in a case where a subsequent circuit block is provided, no propagation timing errors occur in transmitting signals to the subsequent circuit block.

The timing verification is performed until the logical values of the input and output signals IN and OUT become the same or all the delay elements A through C are used completely for each of the inter-block signals DA.

If the number of adjustments is limited by providing another circuit for counting the number of delay adjustments, the time of terminating the verification is clearly defined, so that the verification is performed efficiently.

The configuration of the second embodiment may be combined with the second modified example of the first embodiment.

Embodiment 3

Hereinafter, a third embodiment of the present invention will be described with reference to the drawings.

Figure 10:
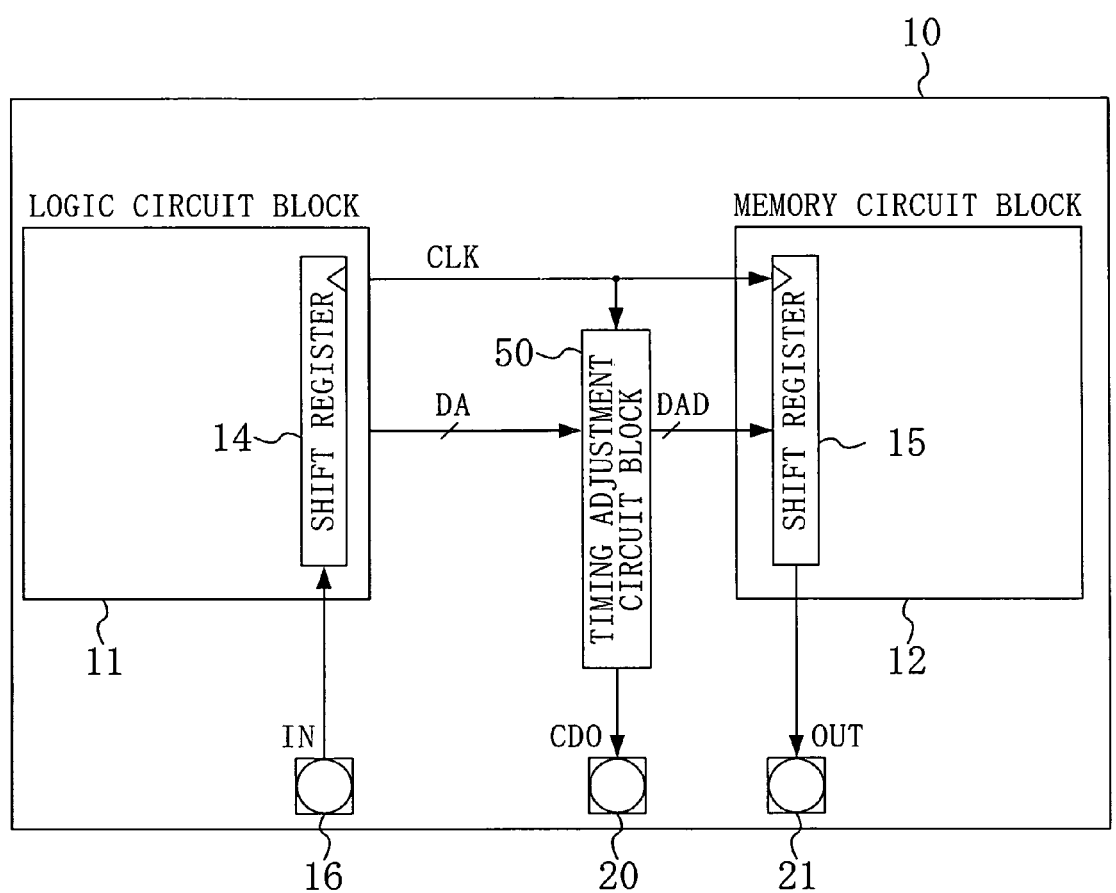
FIG. 10 is a block diagram showing a configuration of a semiconductor device according to a third embodiment of the present invention.

FIG. 10 is a block diagram showing a configuration of a semiconductor device according to the third embodiment. In FIG. 10, each member already shown in FIG. 1 is identified by the same reference numeral and the description thereof will be omitted herein.

In the third embodiment, the delay amount to be added to inter-block signals DA is adjusted by checking whether there is a timing lag between inter-block signals DAD whose propagation timing has been adjusted and a signal (hereinafter, referred to as a determination-period signal) having a signal determination period including at least one of a set-up period and a hold period relative to a clock signal CLK from the outside of the semiconductor device, thereby adjusting the delay amount to be added to the inter-block signals DA.

As shown in FIG. 10, in the semiconductor device of the third embodiment, a timing adjustment circuit block 50 for adjusting a delay amount to be added to the inter-block signals DA output from a logic circuit block 11 is provided between the logic circuit block 11 and a memory circuit block 12.

The timing adjustment circuit block 50 outputs, to a first output pad 20, a timing lag signal CDO representing the amount of a timing lag between the inter-block signals DAD and the determination-period signal.

The memory circuit block 12 includes a second shift register 15 which outputs an output signal OUT to the outside via a second output pad 21.

Figure 11:
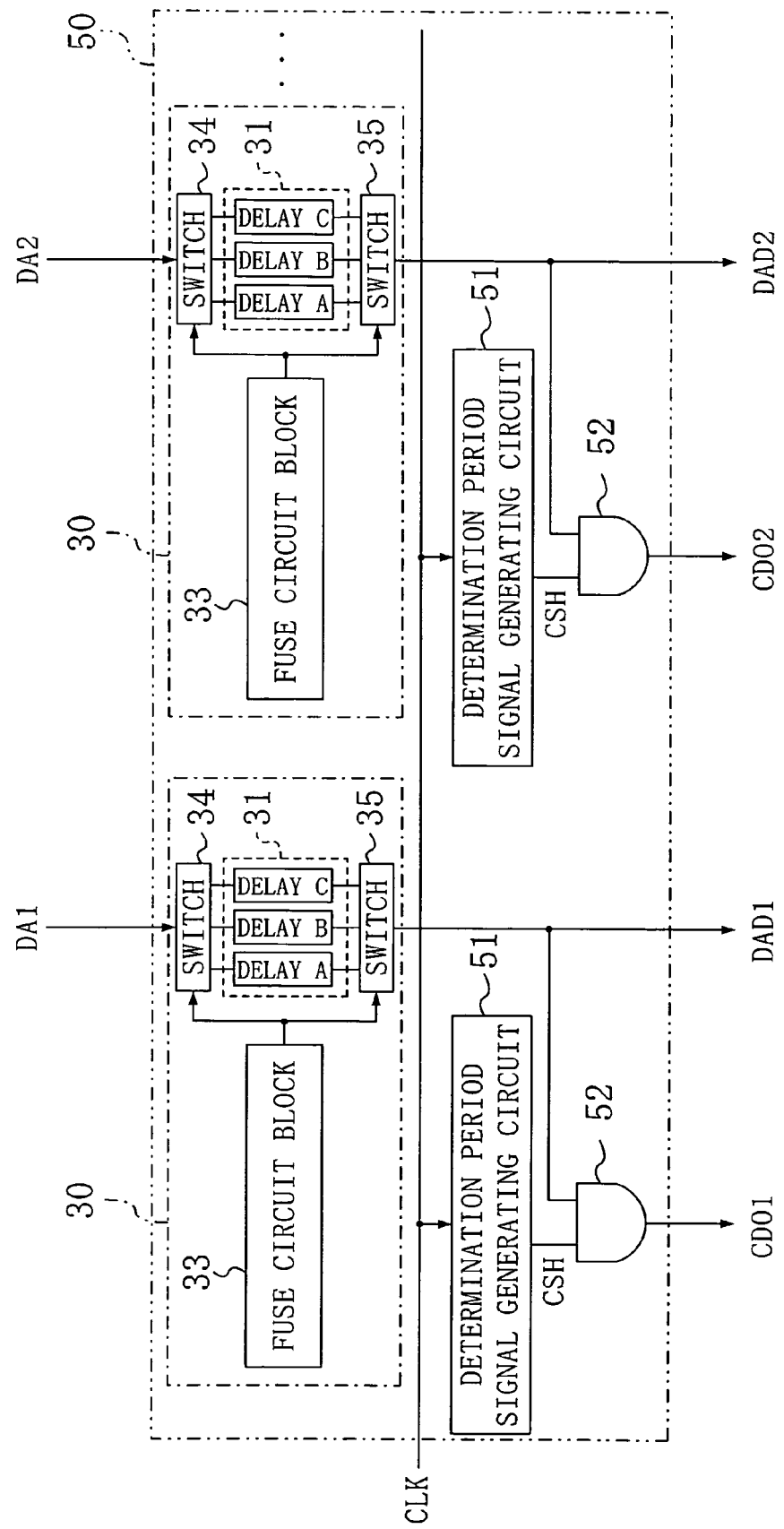
FIG. 11 is a block diagram showing a configuration of a timing adjustment circuit block constituting the semiconductor device of the third embodiment.

FIG. 11 shows a specific example of the timing adjustment circuit block 50. In FIG. 11, each member already shown in FIG. 3 is identified by the same reference numeral and the description thereof will be omitted herein.

As shown in FIG. 11, the timing adjustment circuit block 50 includes: a plurality of timing adjustment circuit units 30 associated with respective parallel inter-block signals such as DA1 and DA2; determination-period-signal generating circuits 51 each of which receives a clock signal CLK and generates and outputs a determination-period signal CSH from the received clock signal CLK; a plurality of AND circuits 52 each of which receives the determination-period signal CSH and an inter-block signal such as DAD1 or DAD2, performs AND operation on the received input signal, and outputs the result as a timing lag signal such as CDO1 or CDO2.

The determination-period signal CSH includes at least one of the set-up period and the hold period determined by the clock signal CLK and the specification of a signal latched in the memory circuit block 12.

Each of the timing adjustment circuit units 30 includes: a delay element block 31 including delay elements A, B and C capable of selecting three delay amounts; a first switch 34; a second switch 35; and a fuse circuit block 33 for allowing the first and second switches 34 and 35 to operate at the same time.

Figure 12:
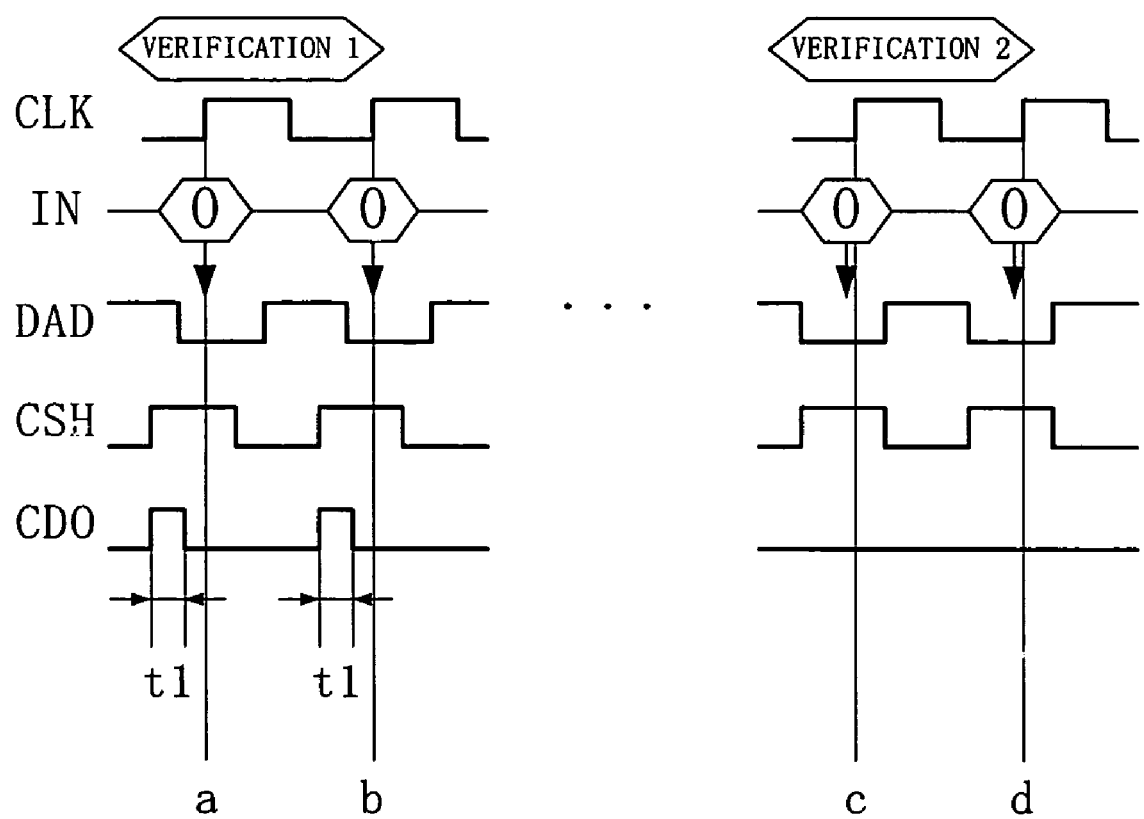
FIG. 12 is timing charts for a timing verification performed on the semiconductor device of the third embodiment.

Hereinafter, a verification method for verifying and adjusting the propagation timing of inter-block signals DA transmitted from the logic circuit block 11 to the memory circuit block 12 in the semiconductor device configured as described above will be described with reference to the timing charts shown in FIG. 12.

First, at the verification timing of time a in a first timing verification, data with the value "0" is input as an input signal IN. The input signal IN is output from the timing adjustment circuit block 50 as an inter-block signal DAD. At this time, AND operation on the inter-block signal DAD and the determination-period signal CSH is performed by each of the AND circuits 52. Each of the AND circuits 52 outputs the result of the AND operation as a timing lag signal CDO. Accordingly, as shown in FIG. 12, if a timing lag occurs between the inter-block signal DAD and the determination-period signal CSH, the timing lag signal CDO is at a high level during period t1 immediately before time a and time b.

In this manner, according to the third embodiment, a timing lag between the inter-block signal DAD and at least one of the set-up period and the hold period of the clock signal CLK is represented as a period during which the timing lag signal CDO is at the high level, thus allowing the amount of the propagation timing lag to be verified visually.

Accordingly, in a second verification, fuses in each of the fuse circuit block 33 are trimmed in such a manner that prevents the timing lag signal CDO from being at the high level, so that the amount of a delay to be added to the inter-block signals DAD is adjusted easily as intended.

The semiconductor device of the third embodiment does not need the comparison control circuit 19 provided in the semiconductor device of the first and second embodiments, so that the circuit configuration is simplified and thus the circuit area is reduced. In addition, the timing adjustment is performed relatively easily with a tester or the like.

If the semiconductor device is configured to change the AND operation on the inter-block signal DAD and the determination-period signal CSH from the outside, the set-up margin can be also confirmed by performing exclusive OR operation which is obtained by reversing the logic with respect to the determination-period signal CSH, for example. That is, the set-up/hold margin can be selectively confirmed, so that the timing adjustment and the timing verification are performed more easily.

At least one of the set-up period and the hold period of the determination-period signal CSH may be selected using a control signal from the outside.

The clock signal CLK may be used instead of the determination-period signal CSH. Then, the determination-period-signal generating circuit 51 is not needed, so that the signal margin is easily confirmed.

Embodiment 4

Hereinafter, a fourth embodiment of the present invention will be described with reference to the drawings.

Figure 13:
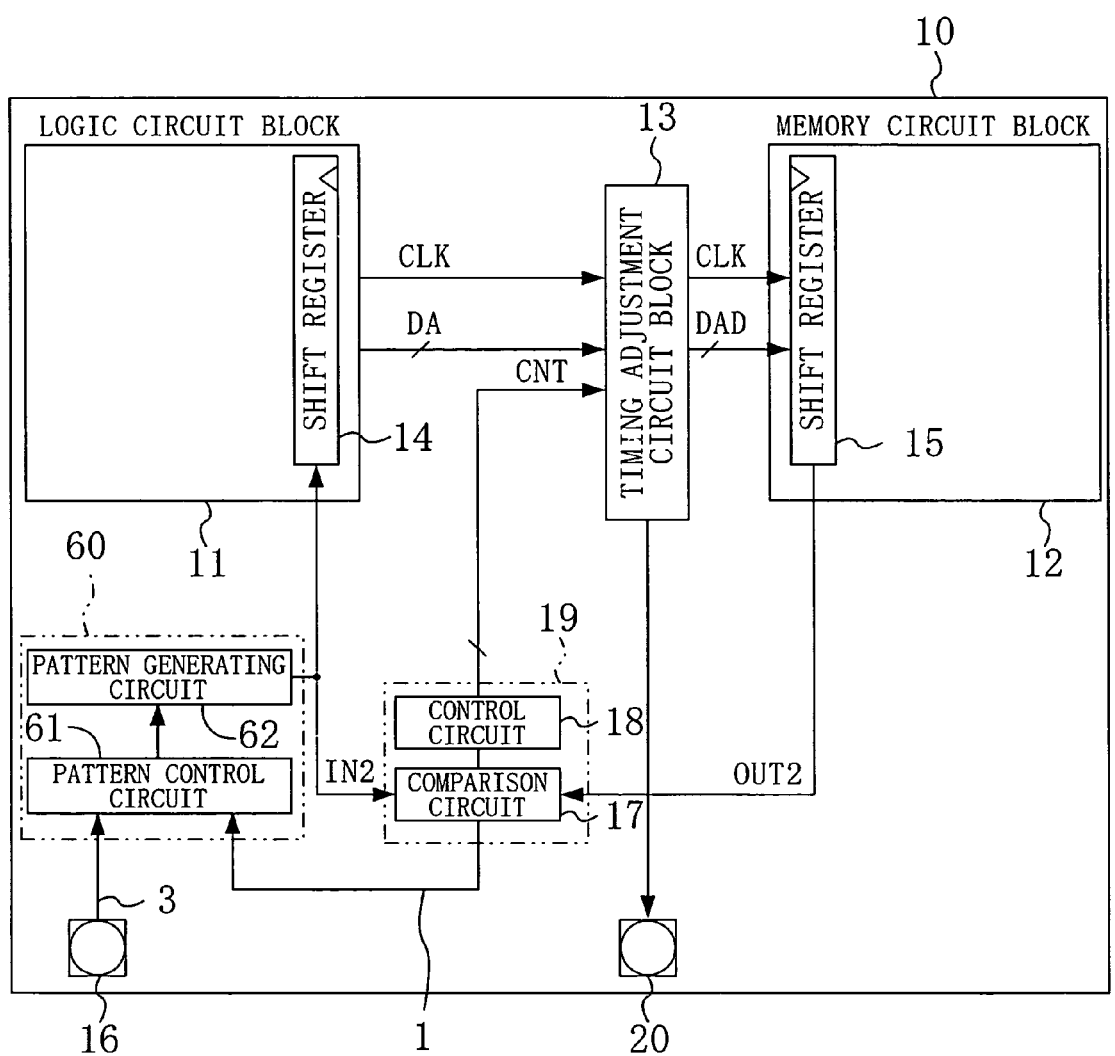
FIG. 13 is a block diagram showing a configuration of a semiconductor device according to a fourth embodiment of the present invention.

FIG. 13 is a block diagram showing a configuration of a semiconductor device according to the fourth embodiment. In FIG. 13, each member already shown in FIG. 1 is identified by the same reference numeral and the description thereof will be omitted herein.

In the fourth embodiment, an input pattern generating circuit block 60 for generating an input signal IN2 is provided on a semiconductor chip 10.

The input pattern generating circuit block 60 includes: a pattern control circuit 61 receiving an input pattern control signal 3 input from the outside; and a pattern generating circuit 62 controlled by the pattern control circuit 61 to generate and output the input signal IN2.

Hereinafter, a verification method for verifying and adjusting the propagation timing of inter-block signals DA transmitted from a logic circuit block 11 to a memory circuit block 12 in the semiconductor device configured as described above will be described.

First, when the timing verification is initialized, an activated input pattern control signal 3 is input to the pattern control circuit 61 via a first input pad 16. Then, the pattern generating circuit 62 outputs an input signal IN2 having a signal pattern in accordance with the input pattern control signal 3 to each of a first shift register 14 in the logic circuit block 11 and a comparison circuit 17 in a comparison control circuit 19.

If the logical values of the input and output signals IN2 and OUT2 differ from each other, the control circuit 18 outputs an activated timing adjustment control signal CNT to the timing adjustment circuit block 13, and the comparison circuit 17 outputs an activated comparison output signal 1 to the pattern control circuit 61, as described in the first embodiment. Then, the pattern control circuit 61 is activated again to cause the pattern generating circuit 62 to output the input signal IN2. In this manner, the timing adjustment is automatically performed until the logical values of the input and output signals IN2 and OUT2 generated inside the semiconductor chip 10 become the same.

As described above, according to the fourth embodiment, as in the first embodiment, at the time when the adjustment of the propagation timing of the inter-block signals DA is repeated automatically to obtain the desired timing, a fuse is melted down based on a fuse information signal FO, so that delay information can be easily fixed.

Moreover, in the verification, input pattern signals whose characteristics are liable to deteriorate are not generated at the outside of the chip, but the input pattern generating circuit 60 for generating an inter-block signal pattern is provided beforehand between each associated circuit blocks. Accordingly, verification accuracy is enhanced, resulting in reduced cost for the verification.

If the number of repeating timing adjustments is set beforehand and an adjustment termination notification signal for notifying that the adjustment is not completed within the set number is added, or if the comparison output signal 1 is output to the outside and the generation of the pattern of the input signal IN2 is stopped with the input pattern control signal 3 to terminate the verification, the verification is performed more effectively.

The fourth embodiment may be combined with the first or second embodiment.

Embodiment 5

Hereinafter, a fifth embodiment of the present invention will be described with reference to the drawings.

Figure 14:
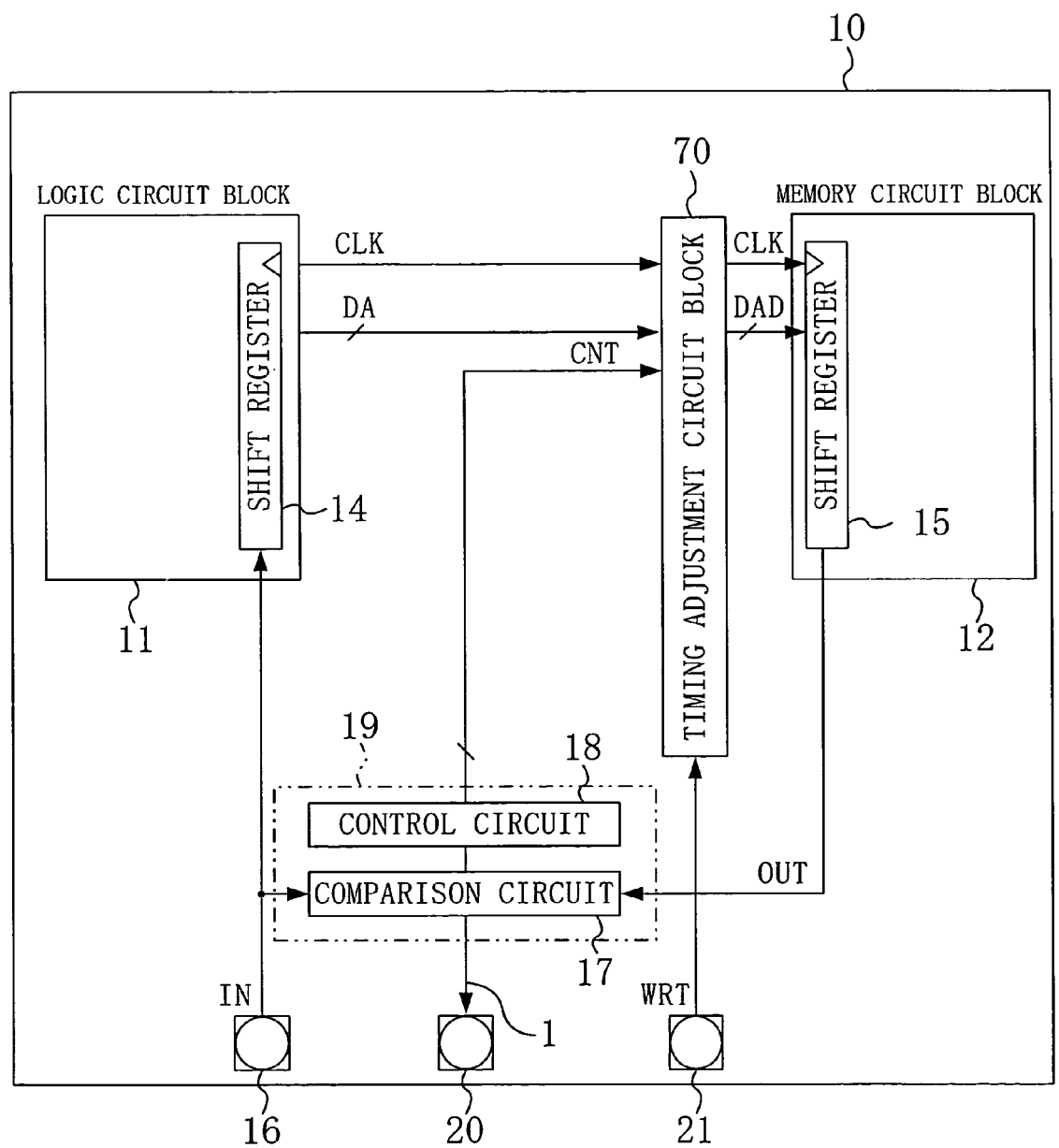
FIG. 14 is a block diagram showing a configuration of a semiconductor device according to a fifth embodiment of the present invention.
Figure 15:
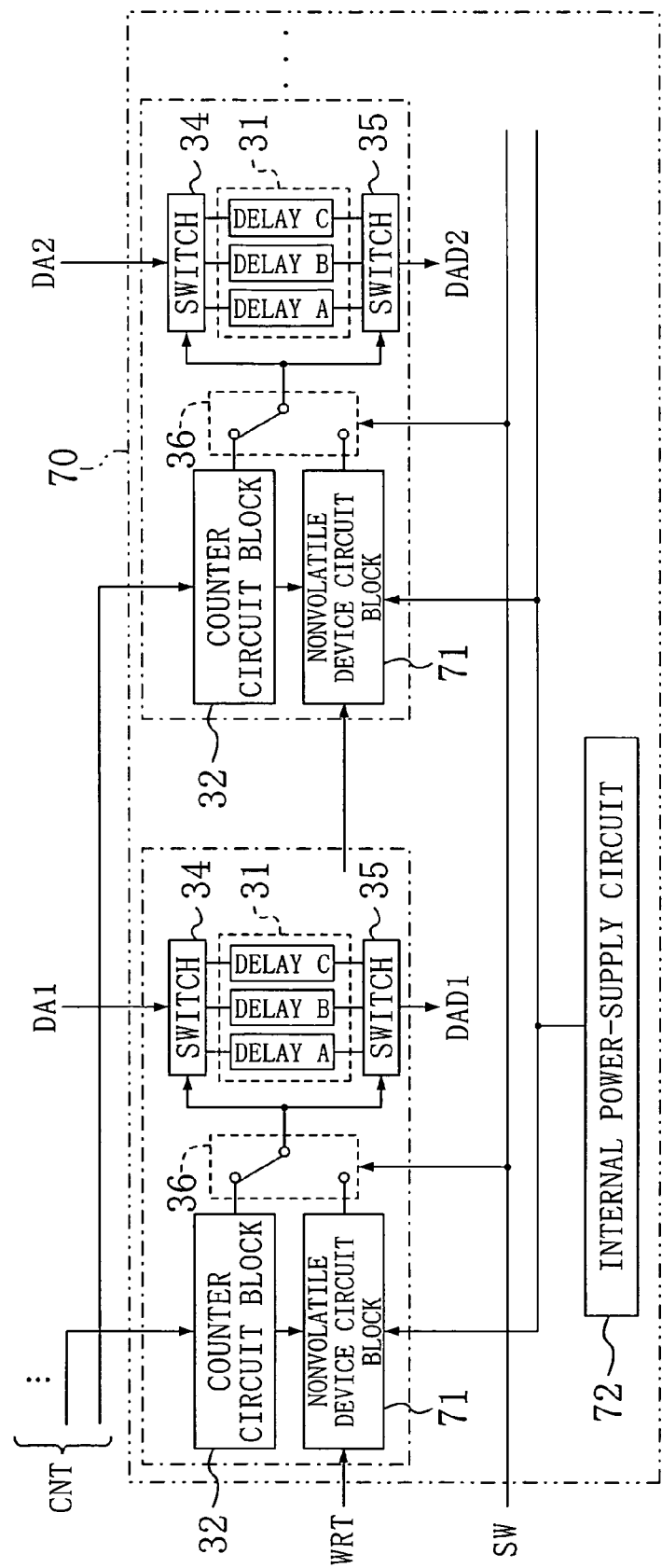
FIG. 15 is a block diagram showing a configuration of a timing adjustment circuit block constituting the semiconductor device of the fifth embodiment.
Figure 16:
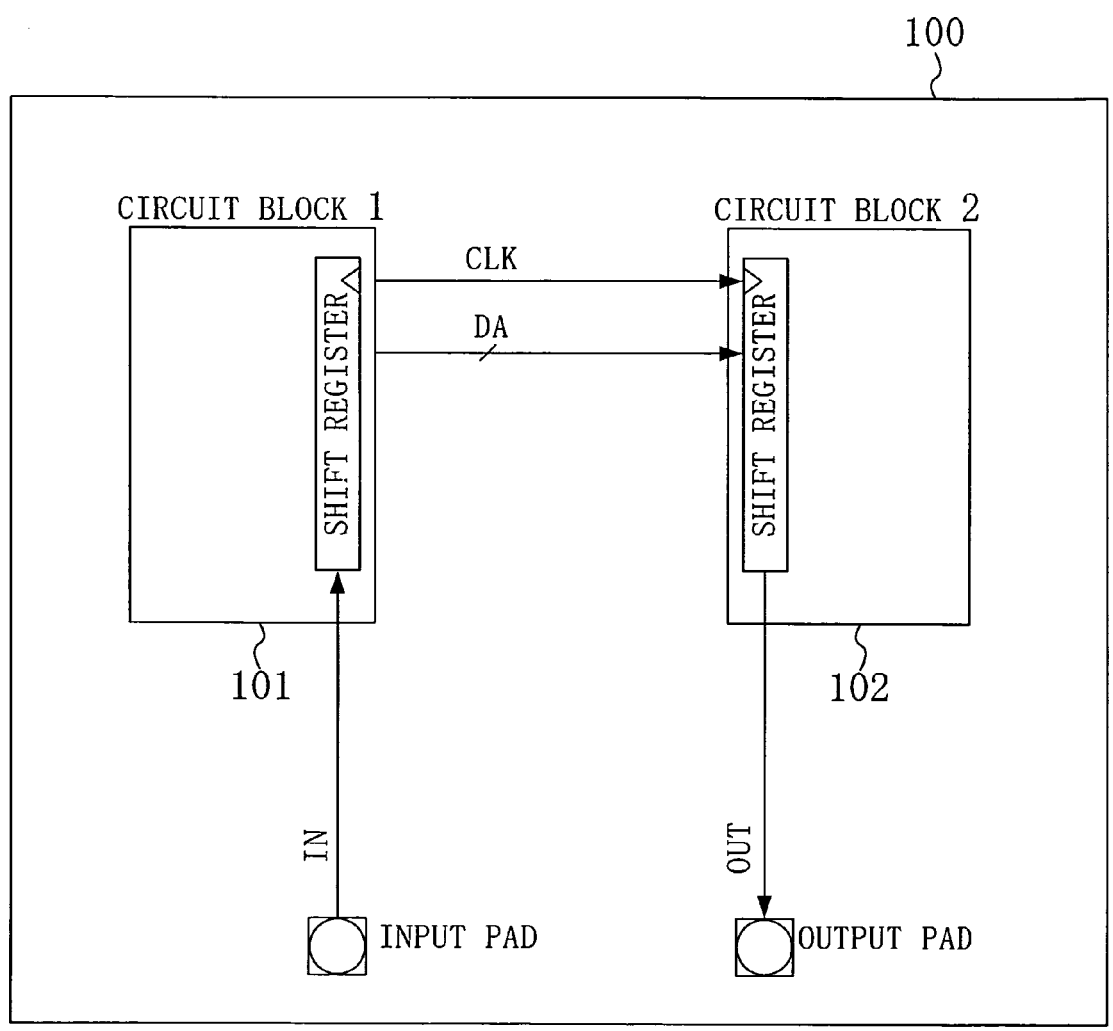
FIG. 16 is a block diagram showing a configuration of a conventional semiconductor device.

FIG. 14 is a block diagram showing a configuration of a semiconductor device according to the fifth embodiment. FIG. 15 shows an example of a configuration of a timing adjustment circuit block according to the fifth embodiment. In FIGS. 14 and 15, each member already shown in FIGS. 1 and 3 is identified by the same reference numeral and the description thereof will be omitted herein.

As shown in FIG. 15, each timing adjustment circuit unit 30 in a timing adjustment circuit block 70 according to the fifth embodiment includes a nonvolatile device circuit block 71 instead of the fuse circuit block. The nonvolatile device circuit block 71 serves as a holding circuit for fixedly holding delay information held by an associated counter circuit block 32. The nonvolatile device circuit block 71 is electrically connected to the counter circuit block 32. The delay information held by the counter circuit block 32 is input to the nonvolatile device circuit block 71.

The timing adjustment circuit block 70 also includes an internal power-supply circuit 72 for supplying a power-supply voltage to the nonvolatile device circuit blocks 71. The internal power-supply circuit 72 is not necessarily provided and the power-supply voltage may be supplied to the nonvolatile device circuit blocks 71 from the outside.

Data is written into each of the nonvolatile device circuit blocks 71 with a write control signal WRT, which is input via a second input pad 22 from the outside, as shown in FIG. 14.

Hereinafter, a verification method for verifying and adjusting the propagation timing of inter-block signals DA transmitted from a logic circuit block 11 to a memory circuit block 12 in the semiconductor device configured as described above will be described.

The verification and adjustment of the timing are the same as in the first and third embodiments but are different in that the delay information sets held by the respective counter circuit blocks 32 are written at the same time by the instruction of the write control signal WRT after the timing verification has terminated.

As described above, according to the fifth embodiment, the delay information held by the counter circuit blocks 32 is fixedly held using the nonvolatile device instead of the fuse. In addition, even if an undesirable timing occurs in a test after the assembly of the chip, the delay information can be rewritten by additional timing verification.

Data may be written into the nonvolatile device circuit blocks 71 using a comparison result of a comparison output signal 1 instead of using the write control signal WRT.

Delay information may be written into the nonvolatile device circuit blocks 71 every time the delay information is changed not after the timing verification but during the timing verification.

In such a case, it is preferable to provide a circuit which allows information held by the nonvolatile device circuit blocks 71 to be written from the nonvolatile device circuit blocks 71 into the counter circuit blocks 32. Then, even at the occurrence of a trouble during the timing verification, delay information immediately before the trouble has been recorded in the nonvolatile device circuit blocks 71, and thus the delay information held by the counter circuit blocks 32 can be restored. As a result, it is unnecessary to repeat the timing verification and adjustment from the beginning once more, thus reducing the verification cost.

In the first through fifth embodiments, the timing adjustment circuit blocks 13, 40, 50, 60 and 70 may be provided inside the memory circuit block 12. For example, the timing adjustment circuit blocks may be configured to delay an internal signal defining the output signal OUT from the memory circuit block 12. Then, it is unnecessary to provide a circuit element for adjusting an output delay from the outside of the memory circuit block 12, so that the chip area can be reduced.

In the embodiments, the inter-block signals DA are transmitted from the logic circuit block 11 to the memory circuit block 12. Alternatively, the inter-block signals DA may be transmitted from the memory circuit block 12 to the logic circuit block 11. The circuit blocks are not limited to the combination of the logic circuit and the memory circuit.

What is claimed is:

1. A semiconductor device comprising:

first and second circuit blocks provided on a semiconductor chip and including respective functional elements;

a timing adjustment circuit block for adjusting a propagation timing of a transmission signal flowing on a line connecting the first and second circuit blocks to each other; and a comparison control circuit for receiving an input signal input to the first circuit block and an output signal output from the second circuit block which has received the transmission signal, comparing the input signal to the output signal, and controlling the timing adjustment circuit block, wherein the comparison control circuit includes a control circuit for outputting timing adjustment control signals to the timing adjustment circuit block when the comparison result shows that the input signal and the output signal differ from each other, the timing adjustment circuit block includes:

a counter circuit for receiving the timing adjustment control signals, and counting and electrically holding the number of the received timing adjustment control signals;

a delay element block which includes at least one delay element and in which a delay amount depending on the number of the timing adjustment control signals is added to the transmission signal; and a fuse circuit which includes at least one fuse and holds the number of the timing adjustment control signals in correspondence with the number of fuses which are melted down, wherein an output signal from the counter circuit or an output signal from the fuse circuit is selectively input to the delay element block, and the fuse is melted down based on the output signal from the counter circuit.

2. The semiconductor device of claim 1, further comprising a switching circuit which generates and outputs a switching control signal for selecting one of the output signals from the counter circuit and the fuse circuit and which includes a fuse.

3. The semiconductor device of claim 1, wherein if a result of a verification performed on the propagation timing of the transmission signal is true, the output signal from the counter circuit is switched to the output signal from the fuse circuit.

4. The semiconductor device of claim 1, wherein the counter circuit has a high output impedance in normal operation, whereas the fuse circuit has a high output impedance in a verification.

5. The semiconductor device of claim 1, wherein the line comprises a plurality of parallel lines, and the counter circuit and the fuse circuit share the timing adjustment control signals for respective transmission signals flowing on the plurality of lines.

6. The semiconductor device of claim 1, wherein the timing adjustment circuit block is also capable of adjusting a propagation timing of a clock signal for determining the propagation timing of the transmission signal.

7. The semiconductor device of claim 1, wherein the counter circuit is reset every time the propagation timing of the clock signal is adjusted.

8. The semiconductor device of claim 1, wherein the propagation timing of the clock signal is adjusted when the adjustment of the propagation timing of the transmission signal fails.

9. The semiconductor device of claim 8, wherein the timing adjustment circuit block includes a determination circuit for receiving the output signal from the counter circuit, determining whether the adjustment of the propagation timing of the transmission signal has succeeded or not, and, if it is determined that the adjustment of the propagation timing of the transmission signal has succeeded, outputting a termination signal for terminating a timing verification.

10. The semiconductor device of claim 9, wherein the termination signal is output when the number of signals input to the determination circuit exceeds a given value.

11. A semiconductor device comprising:

first and second circuit blocks provided on a semiconductor chip and including respective functional elements; and a timing adjustment circuit block for adjusting a propagation timing of a transmission signal flowing on a line connecting the first and second circuit blocks to each other, wherein the line comprises a plurality of parallel lines, and each of the first and second circuit blocks includes a shift register connected to the plurality of lines.

12. The semiconductor device of claim 11, wherein the timing adjustment circuit block repeatedly adjusts the propagation timing of the transmission signal until the input signal and the output signal become the same.

13. The semiconductor device of claim 12, wherein the timing adjustment circuit block includes a circuit for outputting an adjustment termination notification signal for notifying that adjustments of the propagation timings of all the transmission signals flowing on the lines terminate, and the adjustments of the propagation timings terminate when the input signal and the output signal become the same or when the adjustment termination notification signal is output.

14. A semiconductor device comprising:

first and second circuit blocks provided on a semiconductor chip and including respective functional elements; and a timing adjustment circuit block for adjusting a propagation timing of a transmission signal flowing on a line connecting the first and second circuit blocks to each other, wherein the timing adjustment circuit block includes a first holding circuit for holding update information in which the propagation timing of the transmission signal is updated.

15. The semiconductor device of claim 14, wherein the first holding circuit includes at least one fuse.

16. The semiconductor device of claim 14, wherein the timing adjustment circuit block includes a second holding circuit for holding update information in which the propagation timing of the transmission signal is updated, and the second holding circuit performs a parallel-to-serial conversion on the update information and outputs the conversion result.

17. The semiconductor device of claim 14, wherein the first holding circuit is a nonvolatile memory circuit.

18. The semiconductor device of claim 17, wherein the timing adjustment circuit block includes a second holding circuit for holding update information in which the propagation timing of the transmission signal is updated, and the update information is written into the nonvolatile memory circuit from the second holding circuit after a verification of the propagation timing terminates.

19. The semiconductor device of claim 17, further comprising an internal power-supply circuit for supplying a power-supply voltage to the nonvolatile memory circuit.

20. The semiconductor device of claim 17, wherein a power-supply voltage is supplied to the nonvolatile memory circuit from the outside.

21. A semiconductor device comprising: first and second circuit blocks provided on a semiconductor chip and including respective functional elements; and a timing adjustment circuit block provided between the first and second circuit blocks for adjusting a propagation timing of a transmission signal flowing on a line connecting the first and second circuit blocks to each other, wherein the timing adjustment circuit block includes:

a determination period signal generating circuit for generating and outputting a determination period signal for determining the propagation timing of the transmission signal, based on a clock signal for determining the propagation timing of the transmission signal;

a delay element block which includes at least one delay element and in which a delay is added to the transmission signal; and a fuse circuit which includes at least one fuse, the fuse being melted down based on the determination period signal and a transmission signal which has passed through the delay element block.

22. The semiconductor device of claim 21, wherein the pulse signal is a signal having a signal determination period including at least one of a set-up period and a hold period of the transmission signal with respect to the clock signal.

23. The semiconductor device of claim 22, wherein the pulse signal allows at least one of the set-up period and the hold period to be selected with a signal from the outside.

24. The semiconductor device of claim 21, wherein the pulse signal generating circuit generates the pulse signal by performing logical operation on the clock signal and the transmission signal.

25. The semiconductor device of claim 24, wherein the pulse signal is output to the outside.

26. The semiconductor device of claim 21, wherein the propagation timing of the transmission signal is repeatedly adjusted until the adjustment is completed.

27. A semiconductor device comprising:
first and second circuit blocks provided on a semiconductor chip and including respective functional elements;
a timing adjustment circuit block for adjusting a propagation timing of a transmission signal flowing on a line connecting the first and second circuit blocks to each other;
a comparison control circuit for receiving an input signal input to the first circuit block and an output signal output from the second circuit block which has received the transmission signal, comparing the input signal to the output signal, and controlling the timing adjustment circuit block; and
an input pattern generating circuit for generating and outputting the input signal to the first circuit block,
wherein the input pattern generating circuit is activated when the comparison result from the comparison control circuit shows that the input signal and the output signal differ from each other.

28. A semiconductor device comprising:
first and second circuit blocks provided on a semiconductor chip and including respective functional elements;
a timing adjustment circuit block for adjusting a propagation timing of a transmission signal flowing on a line connecting the first and second circuit blocks to each other; and
a comparison control circuit for receiving an input signal input to the first circuit block and an output signal output from the second circuit block which has received the transmission signal, comparing the input signal to the output signal, and controlling the timing adjustment circuit block,
wherein the comparison control circuit includes a control circuit for outputting timing adjustment control signals to the timing adjustment circuit block when the comparison result shows that the input signal and the output signal differ from each other, the timing adjustment circuit block includes:
a counter circuit for receiving the timing adjustment control signals, and counting and electrically holding the number of the received timing adjustment control signals;
a delay element block which includes at least one delay element and in which a delay amount depending on the number of the timing adjustment control signals is added to the transmission signal; and
a nonvolatile memory circuit,
wherein an output signal from the counter circuit or an output signal from the nonvolatile memory circuit is selectively input to the delay element block, and
the number of the timing adjustment control signals is written into the nonvolatile memory circuit based on the output signal from the counter circuit.

29. The semiconductor device of claim 28, wherein the nonvolatile memory circuit is connected to the delay element block after a verification of the propagation timing of the transmission signal.

30. The semiconductor device of claim 28, wherein every time the output value of the counter circuit changes, the output value is written into the nonvolatile memory circuit.

31. The semiconductor device of claim 30, wherein the output value is written into the nonvolatile memory circuit only during a verification of the propagation timing of the transmission signal.

32. A semiconductor device comprising:
first and second circuit blocks provided on a semiconductor chip and including respective functional elements, one of the first and second circuit blocks being a memory circuit block;
a timing adjustment circuit block for adjusting a propagation timing of a transmission signal flowing on a line connecting the first and second circuit blocks to each other; and
an output timing changing circuit for changing the timing of outputting an output signal from the memory circuit block in synchronization with a change of the propagation timing of a clock signal for determining the propagation timing of the transmission signal.

33. The semiconductor device of claim 32, wherein the output timing changing circuit is provided inside the memory circuit block.

* * * * *